United States Patent [19]

Kopf et al.

[11] Patent Number: 5,024,967

[45] Date of Patent: Jun. 18, 1991

[54] DOPING PROCEDURES FOR SEMICONDUCTOR DEVICES

[75] Inventors: Rose F. Kopf, Bound Brook; J. M. Kuo, Edison; Henry S. Luftman, Fanwood; Erdmann F. Schubert, New Providence, all of N.J.

[73] Assignee: AT&T Bell Laboratories, Murray Hill, N.J.

[21] Appl. No.: 374,336

[22] Filed: Jun. 30, 1989

[51] Int. Cl.$^5$ ............................................. H01L 21/20
[52] U.S. Cl. ............................ 437/95; 148/DIG. 41; 148/DIG. 48; 148/DIG. 71; 148/DIG. 94; 437/81; 437/905; 437/963; 437/971
[58] Field of Search ................. 148/DIG. 2, 7, 18, 22, 148/23, 41, 46, 48, 56, 65, 57, 71, 94, 110, 129, 130, 169; 156/610–614; 427/53.1, 54.1, 248.1, 255.1; 437/19, 81, 82, 95, 96, 97, 105, 107, 934, 936, 942, 946, 949, 957, 963, 971, 987

[56] References Cited

U.S. PATENT DOCUMENTS

| | | | |
|---|---|---|---|
| 3,941,624 | 3/1976 | Cho | 156/610 |
| 3,941,624 | 3/1976 | Cho | 437/107 |
| 4,071,383 | 1/1978 | Nagata et al. | 437/107 |
| 4,086,108 | 4/1978 | Gonda | 437/107 |
| 4,447,276 | 5/1984 | Davies et al. | 437/107 |
| 4,581,248 | 4/1986 | Roche | 427/53.1 |
| 4,583,110 | 4/1986 | Jackson et al. | 437/22 |
| 4,645,687 | 2/1987 | Donnelly et al. | 427/53.1 |
| 4,659,401 | 4/1987 | Reif et al. | 437/173 |
| 4,766,087 | 8/1988 | Switzer | 437/15 |
| 4,800,100 | 1/1989 | Herbots et al. | 427/38 |
| 4,829,021 | 5/1989 | Fraas et al. | 437/81 |
| 4,843,029 | 6/1989 | Joyce et al. | 437/173 |
| 4,843,031 | 6/1989 | Ban et al. | 437/173 |
| 4,847,216 | 7/1989 | d'Avitaya et al. | 437/105 |
| 4,871,692 | 10/1989 | Lee et al. | 437/235 |

FOREIGN PATENT DOCUMENTS

| | | |
|---|---|---|
| 2388413 | 4/1977 | France . |
| 59-058878 | 7/1984 | Japan . |
| 63-138765 | 12/1986 | Japan . |
| 4992566 | 4/1987 | Japan . |
| 2034972 | 10/1978 | United Kingdom . |
| 2169444 | 12/1985 | United Kingdom . |
| 2170043 | 7/1986 | United Kingdom . |

OTHER PUBLICATIONS

Crystal Growth of Bulk Crystals: Purification, Doping and Defects, by A. J. R. de Kock, *Handbook on Semiconductors*, vol. 3, S. P. Keller, ed., North-Holland, New York, 1980, Chap. 4, p. 251.

Impurity Profiles of GaAs Epitaxial Layers Doped With Sn, Si, and Ge Grown with Molecular Beam Epitaxy, by A. Y. Cho, *Journal of Applied Physics*, vol. 46, No. 4, Apr. 1975, pp. 1733–1735.

Schubert et al., "Spatial Localization of Impurities in S-Doped GaAs", *Appl. Phys. Lett.*, 52(18), May 2, 1988, pp. 1508–1510.

Chiu et al., "Diffusion Studies of the Si S-Doped GaAs ...", *J. Appl. Phys.*, 64(3), Aug. 1, 1988, pp. 1578–1580.

*Primary Examiner*—Olik Chaudhuri
*Assistant Examiner*—William D. Bunch
*Attorney, Agent, or Firm*—W. G. Nilsen; O. E. Alber

[57] ABSTRACT

A process is described for making semiconductor devices with highly controlled doping profiles. The process involves minimizing or eliminating segregation effects caused by surface electric fields created by Fermi-level pinning. These electric fields act on dopant ions and cause migration from the original deposition site of the doplant ions. Dopant ions are effectively shielded from the surface electric fields by illumination of the growth surfaces and by background doping. Also, certain crystallographic directions in certain semiconductors do not show Fermi-level pinning and lower growth temperatures retard or eliminate segregation effects. Devices are described which exhibit enhanced characteristics with highly accurate and other very narrow doping profiles.

17 Claims, 2 Drawing Sheets

DOPING PROCEDURES FOR SEMICONDUCTOR DEVICES

TECHNICAL FIELD

The invention is a process for making various semiconductor devices, both electronic and optical and the devices made by such processes.

BACKGROUND OF THE INVENTION

Semiconductor device technology has undergone explosive development in recent years. Many new semiconductor devices have been developed, characteristics of known devices have been vastly improved and device integration has continued to be improved. With regard to device integration, packing densities continue to increase and multifunction integrated devices (e.g., optoelectronic devices such as PINFETs) continue to be developed.

A particularly different problem in semiconductor device technology is precise control of doping profiles in the semiconductor materials. Precise doping profiles improve device characteristics and permit greater packing density for various devices (e.g. memory devices, logic devices, etc.) For example, with field effect transistors, precise confinement of the dopants to the doping region improves such characteristics as cut-off voltage, gain characteristics and transconductance. With semiconductor heterojunction lasers, precise confinement of the doping profile to the barrier layer improves various laser characteristics such as threshold current, power output etc.

A particular problem with obtaining desirable doping profile is the redistribution of dopants occurring during crystal growth. It is highly desirable to limit these redistribution effects so as to be able to control the doping profile obtained in semiconductor devices.

A variety of mechanisms contribute to redistribution effects including diffusion of dopant ions, segregation effects of dopant ions, etc. Segregation effects refer to the movement of dopant ions toward the surface of the semiconductor. Segregation effects are mentioned in a number of publications. In one reference (Crystal Growth of Bulk Crystals: Purification, Doping and Defects by A. J. R. DeKock; *Handbook on Semiconductors*, Volume 3, S. P. Keller ed, North-Holland, N.Y., 1980, Cha. 4, especially Page 251) segregation effects are used to explain the purification technique known as zone refining. Also, in a paper by A. Y. Cho (Impurity Profiles of GaAs Epitaxial Layers Doped with Sn, Si, and Ge Grown with Molecular Beam Epitaxy, *Journal of Applied Physics*, Volume 46, No. 4 April 1975), surface segregation effects are used to explain certain doping profiles obtained from crystal structures made by molecular beam epitaxy.

Indeed, segregation effects play a particularly important role with a number of dopant species which would otherwise be used more extensively. For example, tin and zinc have certain very desirable doping characteristics for III-V semiconductor compounds such as gallium arsenide including high specificity to particular doping site. However, segregation effects exhibited by these dopant ions severely limit the use of these dopant ions. Particularly desirable is a procedure which would reduce or eliminate segregation effects and permit fabrication of semiconductor devices with sharp, well defined doping profiles.

SUMMARY OF THE INVENTION

The invention is a process for fabricating semiconductor devices comprising semiconductor material with a highly controlled, precise doping profile. Unique in the process is a crystal growth procedure which minimizes or eliminates the effects of Fermi-level pinning on the doping profile of the semiconductor material. The crystal growth procedure includes steps to screen the dopant ions from the surface electric fields set up by Fermi-level pinning, reduce or eliminate Fermi-level pinning or minimized or eliminate redistribution of dopants due to surface electric fields. Particularly convenient is illumination of the growth surface so as to create electron-hole pairs to shield the surface electric field from the dopant ions. Also useful is background doping to screen the dopant ions from the surface electric fields resulting from Fermi-level pinning. Another procedure is providing crystal growth on crystal surfaces where there is no Fermi-level pinning or where only weak electric field are created by Fermi-level pinning. Also, the effects of the surface electric fields created by Fermi-level pinning are minimized by carrying out the crystal growth process at unusually low temperatures where dopant ion redistribution effects are small. Combinations of the above procedures are also useful. Unique semiconductor devices are fabricated by the above procedure due largely to the sharp, well controlled doping profiles obtained. Exemplatory devices are field effect transistors (FETs) including arrays of FET for logic and memory circuits, lasers, light emitting diodes, heterostructure transistors, selectively doped quantum well transistors, heterobipolar transistors and various combined integrated structures such as PINFET structures. Particularly unique in devices made by the inventive process is the sharp division between doped region and undoped region.

DETAILED DESCRIPTION

Figure 1:
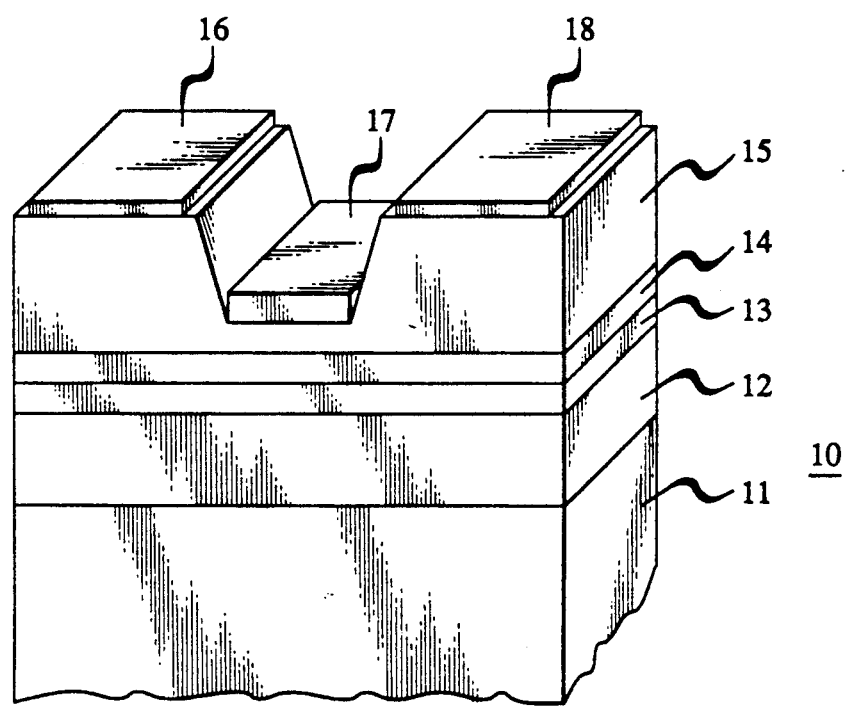
FIG. 1 shows a diagram of a selectively doped heterostructure transistor made in accordance with the invention.

The invention is based on the discovery that segregation effects are due to dopants being pulled along the growth direction by electric fields induced by Fermi-level pining at the semiconductor surface and that segregation effects can be minimized or eliminated by a variety of procedures aimed at reducing the effect of these electric fields on dopant ions. Typical procedures are illumination of the growth surface during crystal growth, background doping to screen the induced electric field from the dopant ions, growth orientations which have no Fermi-level pinning and low growth temperatures where the effect of the induced electric field is minimized. The procedure applies to both n-type and p-type doping. By this procedure, devices can be made with very narrow doping profiles, often with half widths less than 400 or even 100 Angstroms. Under very stringent control conditions, semiconductor devices with doping half widths less than 50 or even 25

Angstroms are obtainable. Minimum half widths of 2 or even 10 Angstroms are generally contemplated.

The procedure can be applied to a large variety of semiconductors including II-VI semiconductor compounds (e.g. ZnSe, CdTe, CdHgTe), III-V semiconductor compounds (e.g. GaAs, InP, GaP, and various ternary and quaternary compounds such as AlGaAs, InGaAs, InGaAsP) and single-element semiconductors such as Si and Ge.

The invention applies to any dopant ion useful for the semiconductor device being made. Typical donor dopants for silicon and germanium are phosphorus, arsenic, antimony and bismuth; for III-V semiconductor compounds are silicon, germanium, tin and tellurium; and for II-VI semiconductor compounds are chlorine, aluminum and gallium. Typical acceptor dopants for silicon and germanium are boron, aluminum, gallium and indium; for III-V semiconductor compounds are beryllium and zinc; and for II-VI semiconductor compounds are lithium, nitrogen and arsenic. The procedure is applicable to a variety of crystal growth techniques where doping profile is of importance. It is especially useful in the growth of semiconductor layers, particularly thin layers by various techniques such as Molecular Beam Epitaxy (MBE), Liquid Phase Epitaxy (LPE), Vapor Phase Epitaxy (VPE) and Metal Organic Chemical Vapor Deposition (MOCVD). The procedure is most useful in the growth of thin layers (e.g. thickness less than 2 $\mu$m or 1 $\mu$m or even $\frac{1}{2}\mu$m) where precise control of doping profile is required. Particularly significant are quantum well devices where very thin layers are used and sharp segregation between doped and undoped regions are highly desirable.

The practice of the invention involves minimizing or eliminating the effects of electric fields induced by Fermi-level pinning at the semiconductor growth surface. Illumination of the growth surface with radiation so as to increase free carrier density is one convenient procedure for minimizing the effect of electric fields on dopant redistribution. Here, for best results, radiation intensity on the growth surface should be high to insure maximum free carrier density. Also, for most efficient production of free carriers, the frequency of at least a portion of the radiation should correspond to an energy greater than the band gap of the semiconductor. Illumination should preferably be maintained during the growth process and until the temperature of the semiconductor is reduced to a temperature range where redistribution effects are negligible. The radiation procedure for minimizing segregation effects is advantageous because no unwanted dopants are introduced to the semiconductor, crystal growth conditions such as temperature, crystal orientation can be optimized for the best crystal growth and device performance rather than minimizing segregation effects and the procedure is relatively simple and easily carried out. The procedure can be carried out with any of the epitaxial growth procedures described above and with either donor or acceptor ions. The illumination procedure is particularly useful with MBE grown layers since this growth procedure is particularly suitable for very thin layers where close control of doping profile is highly advantageous.

The effects of the surface electric field may also be minimized or eliminated by use of background doping during the crystal growth. Here, the primary doping profile is shielded from the surface electric field by introducing background (secondary) doping of the opposite type from the primary doping between the primary doping species and the growth surface. For example, for a p-type primary doping profile (e.g., a thin p-type semiconductor layer), a layer of n-type semiconductor material would be put down to shield the p-type primary doping layer from surface electric fields. Equally useful is the use of p-type background doping to shield an n-type primary doping profile.

Although the concentration of background doping may vary over large limits, typically a concentration within a factor of 10 of the primary doping profile concentration yields satisfactory results. A concentration within a factor of two of the primary doping profile concentration is preferred.

Segregation effects are also minimized or eliminated by choosing a crystallographic growth direction where there is no Fermi-level pinning. Although such growth directions are highly specific, useful devices are made in accordance with this procedure. For example, with III-V semiconductor compounds such as gallium arsenide and indium phosphide, the <011> crystallographic surface does not have Fermi-level pinning and no surface electric fields are developed to cause segregation effects. Similarly, ternary and quaternary III-V semiconductor compounds such as AlGaAs, InGaAs and InGaAsP do not have Fermi-level pinning on the <011> crystallographic surface. The doping profiles of III-V semiconductor compounds grown on this <011> surface are extremely sharp and well defined. Indeed, doping profiles with half-widths (the width of the doping profile at half the maximum doping concentration) of 100 or even 50 or 20 or 10 Angstroms are made conveniently in accordance with the invention.

Another procedure for reducing or eliminating segregation effects is to carry out the growth procedure at an unusually low growth temperature. In this procedure, the rate at which dopant ions move under the influence of the surface electric field is considerably reduced by the lower growth temperature, generally a temperature below 500 or even 450 degrees C. or even 400 degrees C. Under these conditions, growth rates are often reduced to insure high quality crystal growth with low defect densities. For example, with MBE crystal growth, growth rates of less than 0.2 $\mu$m/hr or even 0.1 $\mu$m/hr are often used to insure high crystal quality.

A number of devices are usefully made in accordance with the invention. Shown here are a representative number of devices where precise doping profile is critical to optimum device performance. FIG. 1 shows a diagram of a selectively doped hetreostructure transistor (SDHT) (an FET type device) where precise doping profile is of importance. The transistor structure 10 is made up of a substrate 11 made of gallium arsenide and successive layers of $Al_xGa_{1-x}As$. The aluminum gallium arsenide typically contain from 10 to 40 mole percent aluminum (25 to 35 preferred) and the successive layers are made up of a first layer 12 without doping, a next layer 13 with doping and a top layer 14 without doping. The first layer 12 is a buffer layer, without doping and may vary over large limits in thickness but usually has a thickness of 1000 to 2000 Angstroms. The next layer 13 (called here the doped layer) is doped n-type, typically with silicon or tin in the concentration range from $10^{17}$ to $10^{20}$ carriers per cubic centimeters and has a thickness typically from 2 to 400 Angstroms. Preferred are doped layer thicknesses between 2 and 100 or 2 and 50 or 2 and 20 Angstroms depending on various factors such as device application.

The top layer 14 is undoped and generally quite thin (e.g., 10 to 200 Angstroms). On top of this top layer 14 is a layer of gallium arsenide 15 with source electrode 16, gate electrode 17 and drain electrode 18. A portion 19 of the gallium arsenide layer 15 near the aluminum gallium arsenide layer 14 is undoped but the portion of this layer close to the source 16 and drain 17 is doped n-type to facilitate good ohmic contact. This structure may be part of the array of similar structures or may be integrated with other structures on the same semiconductor chip.

An important aspect of this structure is the doped layer 13. This layer has a high doping concentration with a very sharp doping profile, often with doping profile half widths less than 50 or even 20 Angstroms. This is highly advantageous since dopant ions that migrate into the undoped portion of the gallium arsenide layer 15 become scattering centers and reduce electron mobility. This structure is conveniently made by illumination of the growth surface so as to reduce or eliminate segregation effects that cause redistribution of dopant ions during semiconductor layer growth. Other procedures to reduce or eliminate effects of segregation may be used including background doping, low growth temperature and use of a crystallographic growth surface where Fermi-level pinning does not occur.

Figure 2:
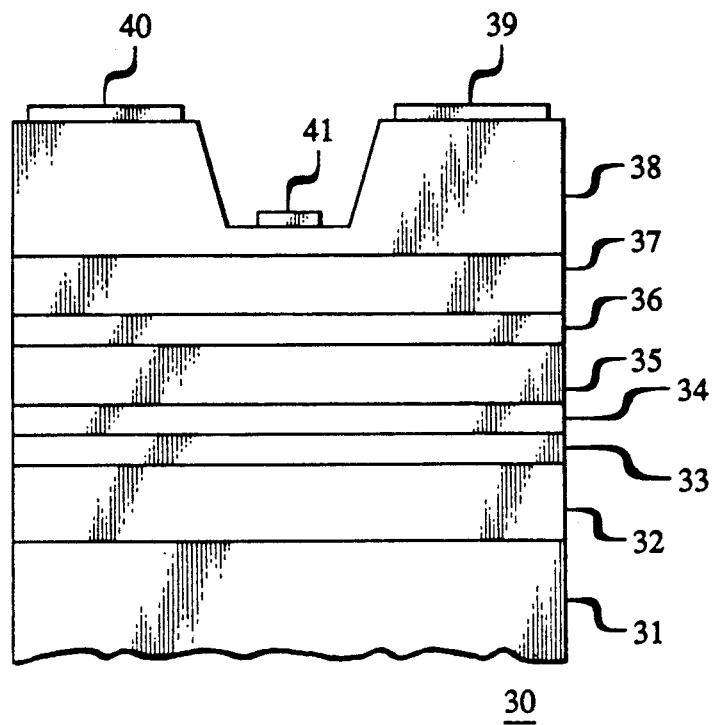
FIG. 2 shows a diagram of a selectively doped quantum well transistor made in accordance with the invention.

FIG. 2 shows a diagram of a selectively doped quantum well structure 30 with a gallium arsenide substrate 31, an undoped layer of aluminum gallium arsenide 32, a doped layer of aluminum gallium arsenide 33 and another undoped layer of aluminum gallium arsenide 34. Typically, the aluminum content of the aluminum gallium arsenide may vary between 10 and 40 mole percent with 25 to 35 mole percent preferred. The doped layer 33 is doped with either silicon or tin in carrier concentrations typically between $10^{17}$ and $10^{20}$ per cubic centimeter. Typically, the first undoped layer 32 of aluminum gallium arsenide has thickness of about 1000 to 2000 Angstroms, the doped layer 33 between 2 and 400 Angstroms with 2 to 50 or 2 to 20 preferred and the top undoped layer 34 with thickness between 10 and 200 Angstroms. On top of the undoped aluminum gallium arsenide layer 34 is the channel layer 35 made of undoped gallium arsenide, a thin layer 36 of undoped aluminum gallium arsenide, then a doped (n-type) layer 37 of aluminum gallium arsenide. This layer 31 is doped as the doped layer 33. Next is a doped gallium arsenide layer 38, doped typically with silicon in the concentration range of $10^{18}$ to $10^{20}$ per cubic centimeter to facilitate fabrication of ohmic contacts at the drain 39, Source 40 and gate 41. In order to obtain devices with superior electronic properties, it is critical to have a sharp doping profile so a minimum of the dopant ions migrate into the channel region 35 where they would create scattering centers and degrade the mobility of the electrons in the channel region.

These devices are typically made by illuminating the growth surfaces so as to reduce or eliminate migration of the dopant ions and produce extremely sharp doping profiles. Reduced growth temperature as well as growth on a crystal plane surface where there is no Fermi-level pinning may also be used to produce these sharp doping profiles. Also useful is background doping to prevent segregation effects or a combination of these procedures.

Figure 3:
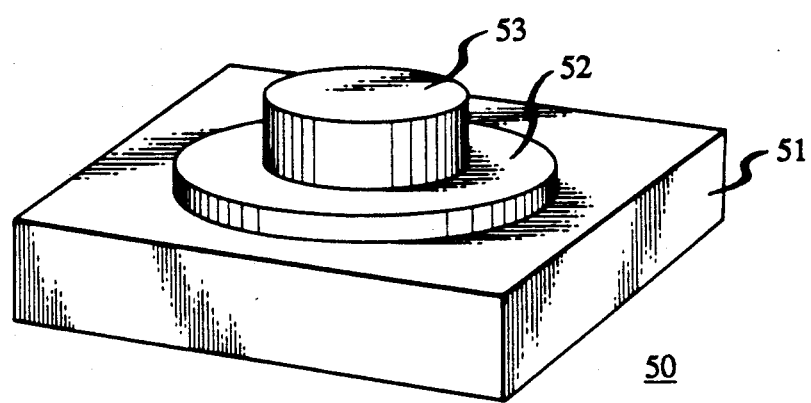
FIG. 3 shows a diagram of a heterobipolar transistor structure made in accordance with the invention.

FIG. 3 shows a diagram of a heterobipolar transistor 50 made in accordance with the invention. The device is made up of a collector 51, which is either part of a gallium arsenide substrate or epitaxial layer of gallium arsenide on top of a substrate. The collector 51 is doped n-type typically with silicon to a concentration of $10^{17}$ to $10^{18}$ carriers per cubic centimeters. On top of the collector 51 is the base 52, made of gallium arsenide and doped p-type typically with beryllium or carbon as high a concentration as possible but typically in the $10^{19}$ to $10^{21}$/cubic centimeter range. On top of the base 52 is the emitter 53, made of aluminum gallium arsenide and doped n-type typically with silicon in the concentration range from $10^{17}$ to $10^{19}$ ions per cubic centimeter. Sharp doping profiles are critical to optimum operation of the device.

Other substances may also be used to make these devices including, for example, indium phosphide and indium gallium arsenide, etc.

We claim:

1. A process for fabricating a semiconductor device comprising a semiconductor body with a doped region having a doping profile, which comprises the steps of
    growing semiconductor material on a surface of a semiconductor body comprising a doped region with a doping profile, and
    minimizing or eliminating segregation effects of surface electric fields, formed by Fermi-level pinning, on the dopants in the doped region, said minimizing or elimination being effected by illuminating the surface of the semiconductor body, on which growth is taking place, with radiation at least some of which has energy greater than the band gap of the semiconductor so as to create electron-hole pairs and shield the surface electric field from the dopants in the doped region.

2. The process of claim 1 in which the semiconductor material is grown by a procedure selected from the group consisting of molecular beam epitaxy, liquid phase epitaxy, vapor phase epitaxy and metal organic chemical vapor deposition.

3. The process of claim 2 in which the semiconductor material is grown by molecular beam epitaxy.

4. The process of claim 1 in which the doping profile has a half width of less than 100 Angstroms.

5. The process of claim 4 in which the half width is less than 20 Angstroms.

6. The process of claim 1 in which the doping profile has a half width of less than 400 Angstroms.

7. The process of claim 1 in which, prior to growing said semiconductor material, background doping is provided between the surface on which the semiconductor is to be grown and the doped region, the conductivity type of the dopant used for background doping being opposite to the dopants in the doped region.

8. The process of claim 1 in which said semiconductor material is grown on a crystallographic surface of the bulk semiconductor material where there is no Fermi-level pinning.

9. The process of claim 1 in which the growth of said semiconductor material is conducted at a temperature below 500° C.

10. The process of claim 1 in which said illumination is continued until the temperature of the semiconductor is reduced to a temperature range wherein segregation effects are negligible.

11. The process of claim 1, in which the device comprises a field effect transistor.

12. The process of claim 1, in which the device comprises a selectively doped heterostructure transistor.

13. The process of claim 1, in which the device comprises a selectively doped quantum well structure.

14. The process of claim 1, in which the device comprises a light emitting diode.

15. The process of claim 1, in which the device comprises a semiconductor laser.

16. The process of claim 1, in which the devices include a heterobipolar transistor.

17. The process of claim 4, in which the half width of the doping profile is less than 50 Angstroms.

* * * * *